(12) United States Patent
Tsukamoto et al.

(10) Patent No.: US 7,737,027 B2
(45) Date of Patent: Jun. 15, 2010

(54) METHOD OF MANUFACTURING A SEMICONDUCTOR DEVICE

(75) Inventors: Akiko Tsukamoto, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 3 days.

(21) Appl. No.: 12/229,808

(22) Filed: Aug. 27, 2008

(65) Prior Publication Data

US 2009/0061620 A1    Mar. 5, 2009

(30) Foreign Application Priority Data

Aug. 29, 2007   (JP)   ............................. 2007-222660

(51) Int. Cl.
*H01L 23/58*   (2006.01)
(52) U.S. Cl. ................ 438/637; 438/639; 257/E21.495
(58) Field of Classification Search ......... 438/637–639; 257/E21.495

See application file for complete search history.

(56) References Cited

U.S. PATENT DOCUMENTS

2006/0151887 A1 * 7/2006 Oh et al. ..................... 257/774

OTHER PUBLICATIONS

Patent Abstracts of Japan, Publication No. 08-330252, Publication Date, Dec. 13, 1996.

* cited by examiner

*Primary Examiner*—Jack Chen
(74) *Attorney, Agent, or Firm*—Adams & Wilks

(57) ABSTRACT

Exuding of a interconnecting material to a substrate, which occurs because of a thinned state of and a beak in a barrier metal layer is prevented, irrespective of a laminated state of the barrier metal layer. In the present invention, a protective layer is formed on a side wall by using an insulating film or the like after the deposition of the barrier metal layer, whereby the interconnecting material can be prevented from exuding to the substrate due to influence of heat treatment such as alloying, irrespective of the laminated state of the side wall of the contact hole and the barrier metal layer. Further, the formation of the protective layer allows the side wall to be smoother to thereby improve coverage of the interconnecting material at the same time.

20 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device.

2. Description of the Related Art

Recent progress in high integration of semiconductor devices has generalized the utilization of multi-layered interconnect in the semiconductor devices. In addition, interconnects and connection holes (contact holes and via holes) are increasingly downsized along with miniaturization of the semiconductor devices, making it more difficult to sufficiently fill interconnecting material into the connection holes. Insufficient filling of connection holes causes bad effects such as a break in interconnection and occurrence of a contact pit. Hence, a conductive barrier metal layer is formed before deposition of an interconnecting material such as Al—Si or Al—Si—Cu. The barrier metal layer is generally formed by depositing Ti or both Ti and TiN by chemical vapor deposition (CVD) Because Ti has better heat resistance and auto-flatness than Al and the like described above, Ti is effective in eliminating the negative effects described above.

The procedure for manufacturing interconnection and connection holes in a conventional semiconductor device is described with reference to FIGS. 2A to 2D.

A first interlayer insulating film 102 and a second interlayer insulating film 101 are formed on a semiconductor substrate 103 by chemical vapor deposition (CVD). A TEOS, a silicon oxide film (BPSG film) including boron and phosphorus, or the like is used for these interlayer insulating films (FIG. 2A).

Next, a contact hole is formed in these interlayer insulating films. Herein, a method of improving coverage of an interconnecting material is described from among several methods of forming a contact hole. First, a resist film 107 is used as a mask and isotropic etching is performed up to a certain depth to expand an opening of a contact hole, and then anisotropic etching is performed to form the contact hole (FIG. 2B).

Subsequently, a barrier metal layer 104 is formed in the connection hole, and an interconnecting material 106 is deposited thereon. Further, a mask pattern is formed on the interconnecting material 106 by a photolithography process to form an interconnect pattern by etching (FIGS. 2C and 2D). (See, for example, JP08-330252 A.)

Problem to be Solved

However, in a case where the barrier metal layer is formed by the method described above, a break in the barrier metal layer may occur. Since the interlayer insulating films including different materials such as TEOS and BPSG are deposited, etch rates are different and hence it is difficult to form an even and smooth side wall. When the side wall of the contact hole is not smooth, uniform deposition of the barrier metal layer becomes difficult to attain, due to, for example, a local thinning of the barrier metal. In addition, the interlayer insulating films are thermally expanded due to influence of heat treatment such as alloying after the deposition of the interconnecting material. As a result, irregularities of the side wall become more remarkable, and a break in the barrier metal layer may occur. When the barrier metal layer breaks or the thickness thereof locally becomes thin, a spiking phenomenon occurs in which silicon exudes from Al—Si—Cu or Al—Si, which is the interconnecting material for an upper layer of the barrier metal layer, to the semiconductor substrate via the barrier metal layer, and then interconnect deterioration and local increase of current (leakage) occur.

FIG. 3 shows a remarkable defect. The presence of an oxide film 108 which is liable to be corroded by etching leads to formation of a reverse tapered structure at the interface between the oxide film 108 and the first interlayer insulating film 102. Since the manufacturing process of a semiconductor is complicated, in which a plurality of insulating films are laminated, there exists a portion which is liable to break or become thin shown as a portion A.

An improved method of providing a side wall in a contact hole is proposed in JP 08-330252 A against the defect described above.

SUMMARY OF THE INVENTION

According to the present invention, there is proposed a method of manufacturing a semiconductor device having a structure in which a break in interconnection can be prevented and a structure in which exuding of the interconnecting material is prevented and generation of a defect is hindered.

In order to solve the above-mentioned problem, the present invention employs the following method of manufacturing.

The present invention provides a method of manufacturing a semiconductor device, in which a contact hole and interconnects are formed, the method including: forming a first insulating film and a second insulating film on a semiconductor substrate; forming the contact hole connecting the semiconductor substrate and the interconnect formed on the first insulating film and the second insulating film; depositing a barrier metal layer thereon and then depositing a protective layer for giving protection against exuding of an interconnecting material to the semiconductor substrate to etch an unnecessary portion; depositing the interconnecting material thereon; and forming a interconnect mask pattern by a photolithography technology and forming an interconnect pattern by etching.

In the present invention, another interconnect layer is further formed above the first interconnect layer. A plurality of interconnect layers may be formed on the first interconnect layer. Further, as to the lamination of the insulating film such as the second insulating film, a material thereof and the number of layers is appropriately selected, and the configuration thereof is not limited.

Benefit of the Invention

Through the formation of the protective layer made of an insulating film on the side wall after the deposition of the barrier metal layer, the interconnecting material can be prevented from exuding to the semiconductor substrate due to the influence of the heat treatment such as alloying, irrespective of the laminated state of the side wall of the contact hole and the barrier metal layer. Besides, through the formation of the protective layer, the side wall can be made smoother, and hence the coverage of the interconnecting material can be improved at the same time. Further, isotropic etching is performed on the protective layer. Accordingly, a photomask or a photolithography process needs not to be added particularly for etching of the protective layer. Only deposition and etching processes for the protective layer need to be added.

Further, the protective layer is formed on the barrier metal layer, and hence the interconnecting material can be prevented from exuding to the semiconductor substrate due to the influence of the heat treatment such as alloying, irrespective of lamination variation in barrier metal layer.

DETAILED DESCRIPTION OF THE PREFERRED EMBODIMENTS

A method of implementing the present invention is described with reference to FIGS. 1 and 4A to 4F.

Hereinafter, a first embodiment of the present invention is described.

Figure 4A:
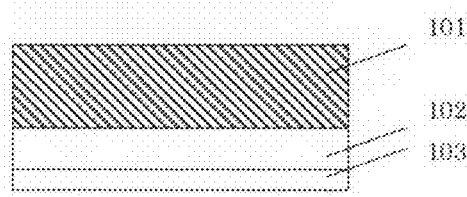
FIGS. 4A to 4F are schematic sectional views in a process order, showing a method of manufacturing a semiconductor device according to an embodiment of the present invention.

First, a silicon oxide film serving as a first interlayer insulating film 102 is formed on a semiconductor substrate 103 by CVD. Further, a second interlayer insulating film 101 such as a BPSG film is deposited on the silicon oxide film (FIG. 4A). A resist film 107 is formed on the second interlayer insulating film 101, and a photomask is formed by a photolithography technology.

Figure 4D:
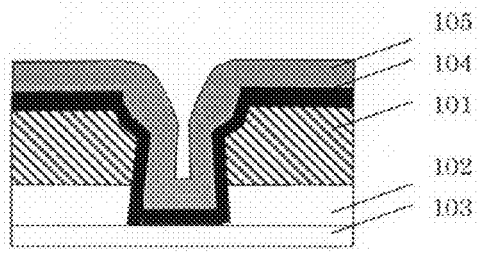
Figure 4B:
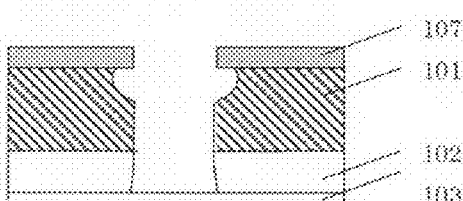

Next, isotropic etching is performed up to a certain depth to expand an opening of a contact hole, and then anisotropic etching is performed to form the contact hole (FIG. 4B). Besides, there is a method of performing heat treatment to round corners of the opening of the contact hole. Though those methods, a break in the interconnecting material and coverage can be improved.

Figure 4E:
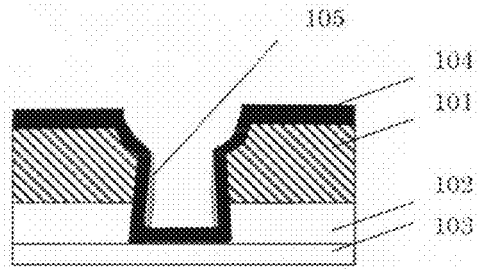
Figure 4C:
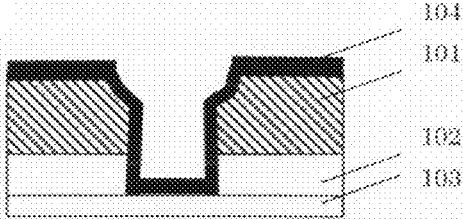

Then, a barrier metal layer 104 is formed on an inner wall of the contact hole. Ti or both Ti and TiN are used for the barrier metal layer 104 in many cases. Ti or both Ti and TiN are formed on the element by sputtering (FIG. 4C).

In the sputtering process, when the side wall of the contact hole is not smooth, the thickness of the barrier metal layer locally reduces or the barrier metal breaks, whereby the silicon within the interconnecting material of the upper layer exudes in the semiconductor substrate. In order to dissolve this exuding, a protective layer 105 made of an insulating film is deposited after the deposition of the barrier metal layer by sputtering (FIG. 4D). A BPSD film or an NSG film may be used as the protective layer. Subsequently, the protective layer 105 is partially removed by anisotropic etching. Through anisotropic etching, the insulating film can be left, without using a photomask, on a surface of the barrier metal layer formed on the side wall of the contact hole, and on a surface of the barrier metal layer formed on a side bottom surface, which corresponds to a junction between the side wall of the contact hole and a bottom surface thereof (FIG. 4E). With this structure, the surface of the barrier metal layer inside the contact hole is made smooth to thereby produce an effect of improving the coverage of a interconnecting material which is formed thereafter.

Figure 1:
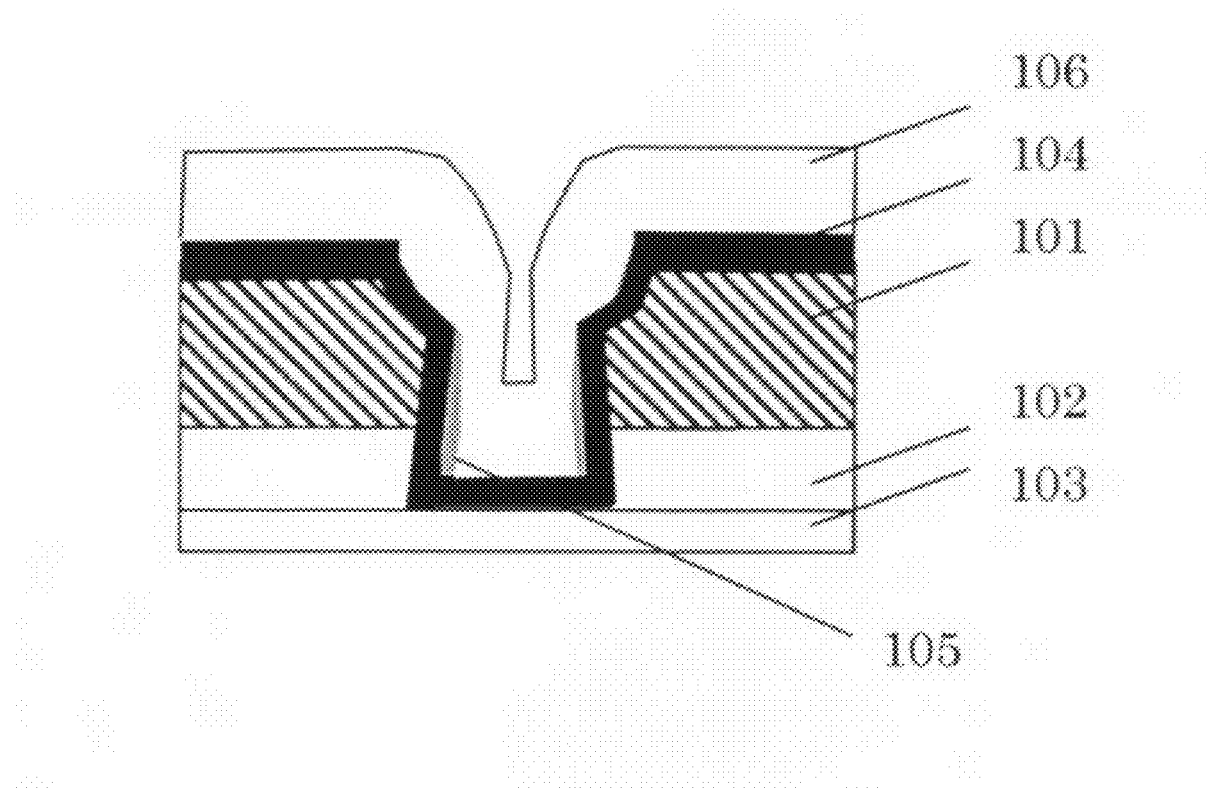
FIG. 1 is a schematic sectional view showing an example of a semiconductor device manufactured by a method of manufacturing a semiconductor device according to the present invention.
Figure 2A:
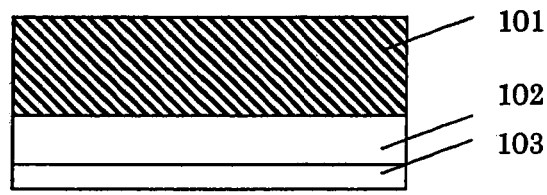
FIGS. 2A to 2D are schematic sectional views in a process order, showing a method of manufacturing a conventional semiconductor device.
Figure 2B:
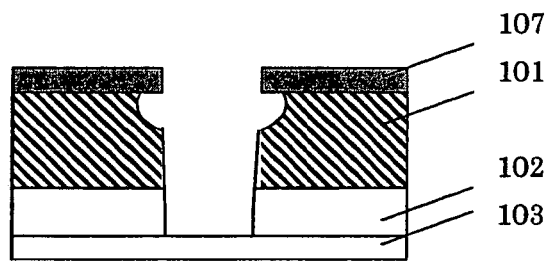
Figure 2C:
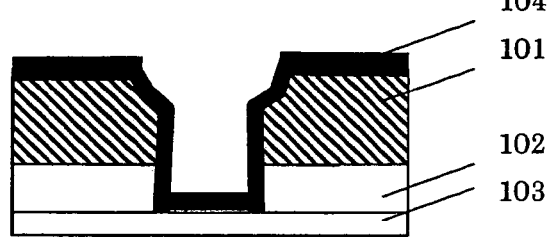
Figure 2D:
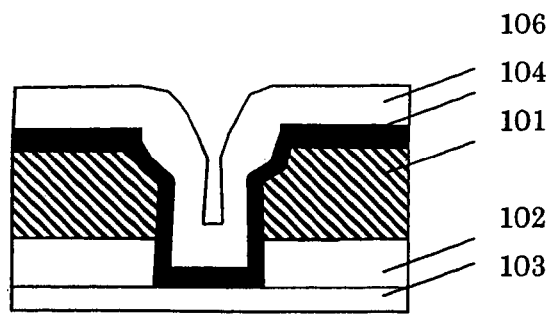
Figure 4F:
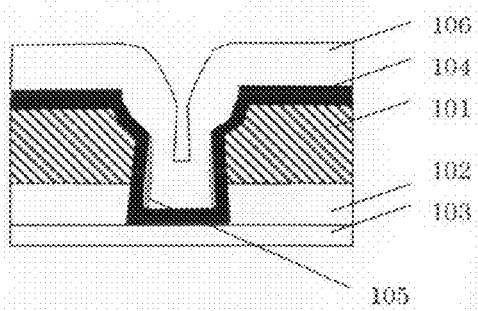

Next, an interconnecting material 106 such as Al—Si or Al—Si—Cu is deposited by sputtering. Though not shown in the figures particularly, a resist film is applied on the interconnecting material to form a mask pattern, and then an interconnect pattern is formed by etching (FIGS. 1 and 4F).

Hereinafter, a second embodiment of the present invention is described.

Figure 3:
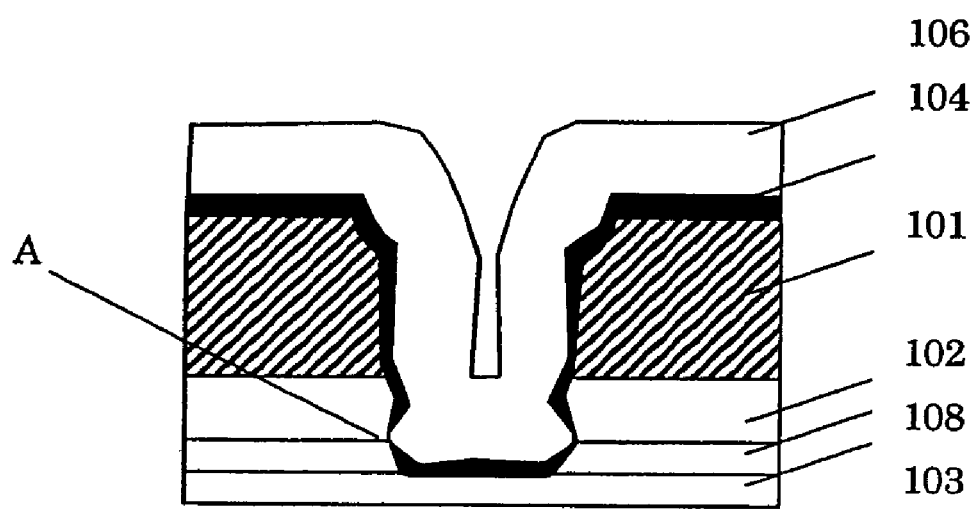
FIG. 3 is a schematic sectional view showing a defect in the conventional semiconductor device.

In the first embodiment of the present invention described above, in a case where a thin film which is easier to be etched than the first interlayer insulating film exists between the semiconductor substrate and the first interlayer insulating film, there is a portion in which the thickness of the barrier metal layer is locally reduced as shown in FIG. 3. The protective film is deposited thereon. Then, through anisotropic etching, the insulating film can be left on the surface of the barrier metal layer formed on the side wall of the contact hole, and on the surface of the barrier metal layer formed on the side bottom surface, which corresponds to a junction between the side wall of the contact hole and the bottom surface thereof. With this structure, the surface of the barrier metal layer inside the contact hole is made smooth to thereby produce an effect of improving the coverage of a interconnecting material which is formed thereafter.

What is claimed is:

1. A method of manufacturing a semiconductor device, comprising:

forming a first interlayer insulating film on a surface of a semiconductor substrate;

forming a second interlayer insulating film on a surface of the first interlayer insulating film;

performing patterning on a resist film applied on a surface of the second interlayer insulating film;

using the resist film as a mask, isotropically etching the first interlayer insulating film and the second interlayer insulating film to a preselected depth to form an opening for a contact hole followed by anisotropically etching the first interlayer insulating film and the second interlayer insulating film to form the contact hole having an upper part with a sloped surface and a lower part extending from the upper part and up to the surface of the semiconductor substrate;

forming a barrier metal layer on an inner wall of the contact hole and on the surface of the second interlayer insulating film;

depositing a protective film made of an insulating film on a surface of the barrier metal layer;

performing anisotropic etching to the protective film to leave the insulating film having a side wall shape so as to cover the surface of the barrier metal layer formed on a side wall of the contact hole, and the surface of the barrier metal layer formed on a side bottom surface of a contact hole, which corresponds to a junction between a side wall of the contact hole and a bottom surface of the contact hole;

depositing an interconnecting material on the insulating film of the side wall shape, the barrier metal layer, and the surface of the second interlayer insulating film; and etching the barrier metal layer and the interconnecting material into a desired shape.

2. A method of manufacturing a semiconductor device according to claim 1; wherein:

the protective film comprises one of a BPSG film and an NSG film; and the barrier metal layer comprises one of a TiN and a two-layered film including Ti and TiN.

3. A method of manufacturing a semiconductor device according to claim 1; wherein the anisotropic etching is performed to the protective film so that the insulating film does not cover the sloped surface of the upper part of the contact hole.

4. A method of manufacturing a semiconductor device according to claim 1; wherein the sloped surface of the upper part of the contact hole is formed during isotropic etching of the first interlayer insulating film and the second interlayer insulating film.

5. A method of manufacturing a semiconductor device according to claim 1; wherein the sloped surface of the upper part of the contact hole is formed with a concave-shape.

6. A method of manufacturing a semiconductor device, comprising:

forming a first interlayer insulating film on a surface of a semiconductor substrate;

forming between the semiconductor substrate and the first interlayer insulating film a thin film having a composition that is easier to etch than the first interlayer insulating film;

forming a second interlayer insulating film on a surface of the first interlayer insulating film;

performing patterning on a resist film applied on a surface of the second interlayer insulating film;

using the resist film as a mask, isotropically etching the first interlayer insulating film and the second interlayer insulating film to a preselected depth to form an opening for a contact hole followed by anisotropically etching the first interlayer insulating film and the second interlayer insulating film to form the contact hole having an upper part with a sloped surface and a lower part extending from the upper part and up to the surface of the semiconductor substrate;

forming a barrier metal layer on an inner wall of the contact hole and on the surface of the second interlayer insulating film;

depositing a protective film made of an insulating film on a surface of the barrier metal layer;

performing anisotropic etching on the protective film to leave the insulating film in a side wall shape so as to cover the surface of the barrier metal layer formed on a side wall of the contact hole, and the surface of the barrier metal layer formed on a side bottom surface of a contact hole, which corresponds to a junction between a side wall of the contact hole and a bottom surface of the contact hole;

depositing a interconnecting material on the insulating film in the side wall shape, the barrier metal layer, and the surface of the second interlayer insulating film; and etching the barrier metal layer and the interconnecting material into a desired shape.

7. A method of manufacturing a semiconductor device according to claim 6; wherein:

the protective film comprises one of a BPSG film and an NSG film; and the barrier metal layer comprises one of a TiN and a two-layered film including Ti and TiN.

8. A method of manufacturing a semiconductor device according to claim 6; wherein the anisotropic etching is performed to the protective film so that the insulating film does not cover the sloped surface of the upper part of the contact hole.

9. A method of manufacturing a semiconductor device according to claim 6; wherein the sloped surface of the upper part of the contact hole is formed during isotropic etching of the first interlayer insulating film and the second interlayer insulating film.

10. A method of manufacturing a semiconductor device according to claim 6; wherein the sloped surface of the upper part of the contact hole is formed with a concave-shape.

11. A method of manufacturing a semiconductor device, comprising the steps of:

forming a first interlayer insulating film on a surface of a semiconductor substrate;

forming a second interlayer insulating film on a surface of the first interlayer insulating film;

forming a resist film on a surface of the second interlayer insulating film;

patterning the resist film;

etching the first interlayer insulating film and the second interlayer insulating film using the patterned resist film as a mask to form a contact hole having an upper part with a sloped surface and a lower part extending from the upper part and up to the surface of the semiconductor substrate;

forming a barrier metal layer on an inner wall of each of the upper part and the lower part of the contact hole;

depositing an insulating film on a surface of the barrier metal layer formed on the inner wall of each of the upper part and the lower part of the contact hole;

anisotropically etching the insulating film so that the insulating film covers the inner wall of the lower part of the contact hole but not the inner wall of the upper part of the contact hole;

depositing an interconnecting material on the etched insulating film, the barrier metal layer, and the surface of the second interlayer insulating film; and etching the barrier metal layer and the interconnecting material into a desired shape.

12. A method according to claim 11; further comprising the step of, before the step of forming the second interlayer insulating film, forming between the semiconductor substrate and the first interlayer insulating film a thin film having a composition that is easier to etch than the first interlayer insulating film.

13. A method according to claim 12; wherein the insulating film comprises one of a BPSG film and an NSG film; and wherein the barrier metal layer comprises one of a TiN and a two-layered film including Ti and TIN.

14. A method according to claim 11; wherein the insulating film comprises one of a BPSG film and an NSG film; and wherein the barrier metal layer comprises one of a TiN and a two-layered film including Ti and TIN.

15. A method according to claim 11; wherein the step of etching the first interlayer insulating film and the second interlayer insulating film comprises the steps of isotropically etching the first interlayer insulating film and the second interlayer insulating film followed by anisotropically etching the first interlayer insulating film and the second interlayer insulating film to form the upper and lower parts of the contact hole.

16. A method according to claim 15; wherein the upper part of the contact hole is formed with a sloped surface.

17. A method according to claim 16; wherein the sloped surface of the upper part of the contact hole is formed during isotropic etching of the first interlayer insulating film and the second interlayer insulating film.

18. A method according to claim 17; further comprising the step of, before the step of forming the second interlayer insulating film, forming between the semiconductor substrate and the first interlayer insulating film a thin film having a composition that is easier to etch than the first interlayer insulating film.

19. A method of manufacturing a semiconductor device according to claim 16; wherein the sloped surface of the upper part of the contact hole is formed with a concave-shape.

20. A method according to claim 19; further comprising the step of, before the step of forming the second interlayer insulating film, forming between the semiconductor substrate and the first interlayer insulating film a thin film having a composition that is easier to etch than the first interlayer insulating film.

* * * * *